(12) United States Patent
Tuttle

(10) Patent No.: US 7,696,885 B2
(45) Date of Patent: Apr. 13, 2010

(54) METHODS AND SYSTEMS OF ATTACHING A RADIO TRANSCEIVER TO AN ANTENNA

(75) Inventor: John R Tuttle, Boulder, CO (US)

(73) Assignee: Round Rock Research, LLC, Mt. Kisco, NY (US)

( * ) Notice: Subject to any disclaimer, the term of this patent is extended or adjusted under 35 U.S.C. 154(b) by 204 days.

(21) Appl. No.: 11/766,276

(22) Filed: Jun. 21, 2007

(65) Prior Publication Data

US 2008/0315991 A1 Dec. 25, 2008

(51) Int. Cl.
 G08B 13/14 (2006.01)
 H01Q 9/38 (2006.01)
 H01Q 1/48 (2006.01)
 H01Q 17/00 (2006.01)
 H01L 21/00 (2006.01)
 H01L 23/02 (2006.01)

(52) U.S. Cl. .............. 340/572.7; 340/572.1; 340/572.3; 340/572.4; 343/829; 343/845; 343/846; 343/848; 438/106; 438/107; 438/108; 438/118; 438/119; 257/679; 257/680; 29/600; 29/601

(58) Field of Classification Search .............. 340/572.1, 340/572.7, 572.8; 343/829, 845, 846, 848; 438/106–108, 118, 119; 257/679; 29/600–601
See application file for complete search history.

(56) References Cited

U.S. PATENT DOCUMENTS

| | | | | |
|---|---|---|---|---|
| 5,528,222 A | * | 6/1996 | Moskowitz et al. | 340/572.7 |
| 5,939,984 A | * | 8/1999 | Brady et al. | 340/572.1 |
| 6,314,275 B1 | * | 11/2001 | Pedersen et al. | 455/90.3 |
| 6,448,933 B1 | * | 9/2002 | Hill et al. | 343/702 |
| 6,593,886 B2 | * | 7/2003 | Schantz | 343/700 MS |
| 6,741,178 B1 | * | 5/2004 | Tuttle | 340/572.1 |
| 6,888,502 B2 | | 5/2005 | Beigel et al. | |
| 6,998,709 B2 | * | 2/2006 | Khorram | 257/728 |
| 7,329,950 B2 | * | 2/2008 | Khorram | 257/728 |
| 2004/0246180 A1 | * | 12/2004 | Okado | 343/700 MS |
| 2005/0275591 A1 | | 12/2005 | King et al. | |
| 2008/0065676 A1 | * | 3/2008 | Hause et al. | 707/102 |
| 2009/0266896 A1 | | 10/2009 | Tuttle | |

\* cited by examiner

*Primary Examiner*—Benjamin C Lee
*Assistant Examiner*—Lam P Pham
(74) *Attorney, Agent, or Firm*—Greenberg Traurig, LLP

(57) ABSTRACT

Methods and systems of attaching a radio transceiver to an antenna. At least some of the illustrative embodiments are systems comprising an antenna and an integrated circuit configured to operate as a radio transceiver. The antenna comprises a ground plane having a first edge surface, and an active element having a second edge surface. The ground plane and the active element are retained together such that the first and second edge surfaces are substantially coplanar and form an antenna edge. The integrated circuit is configured to operate as a radio transceiver, and the integrated circuit is mechanically coupled to the edge of the antenna and electrically coupled to the active element.

7 Claims, 4 Drawing Sheets

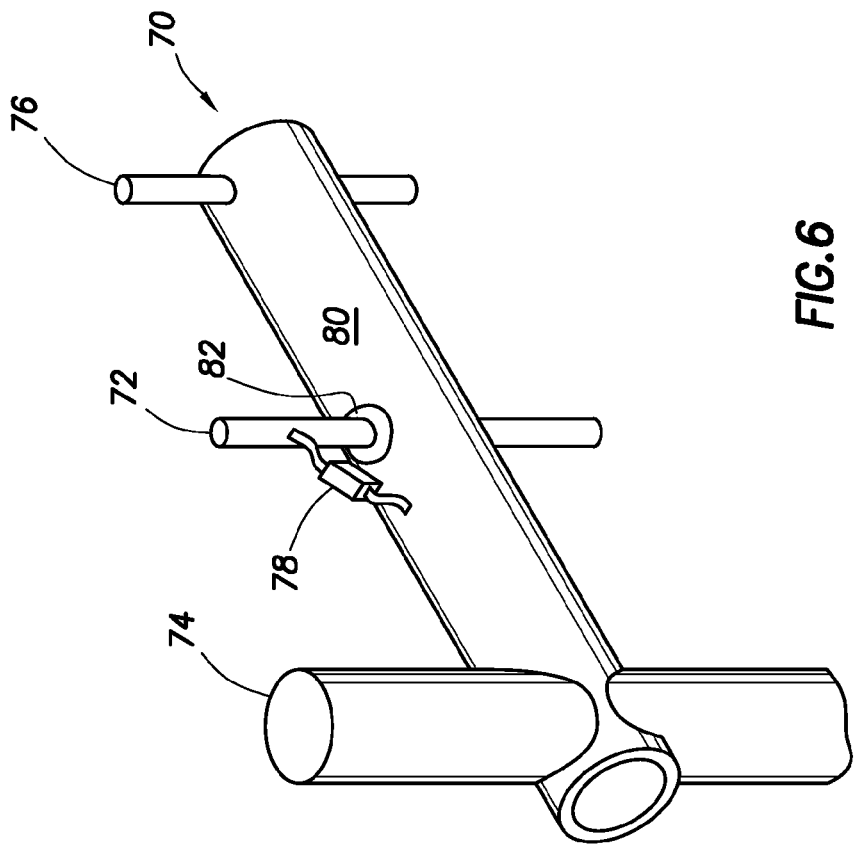
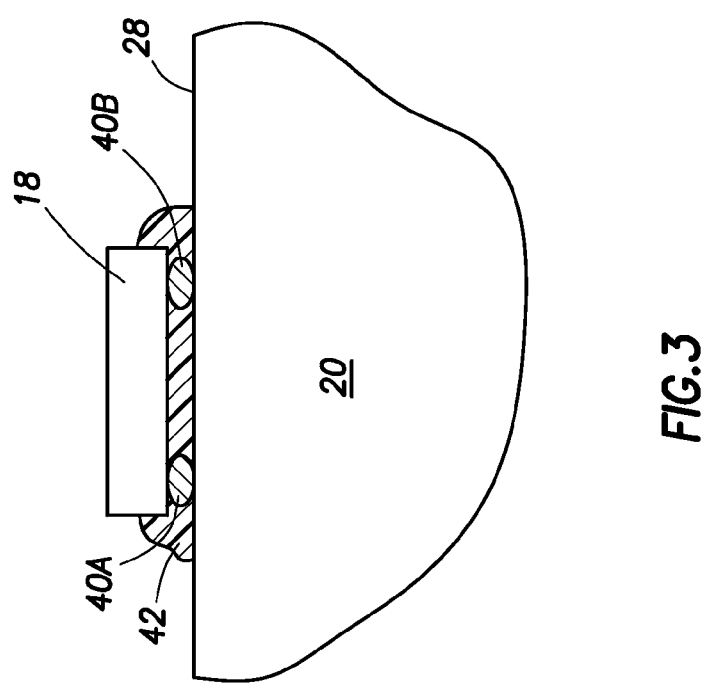

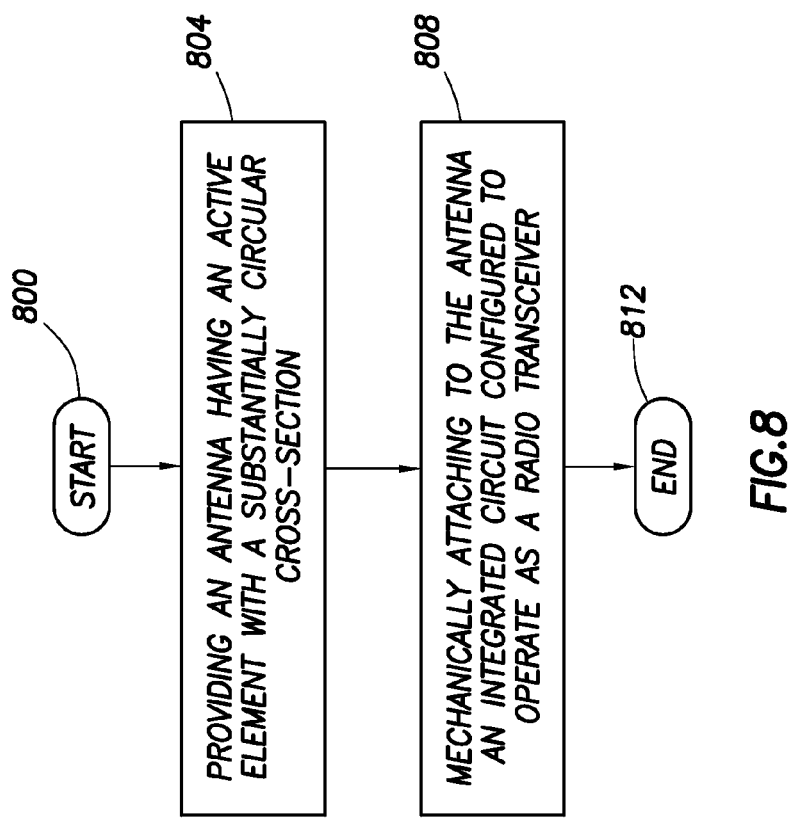
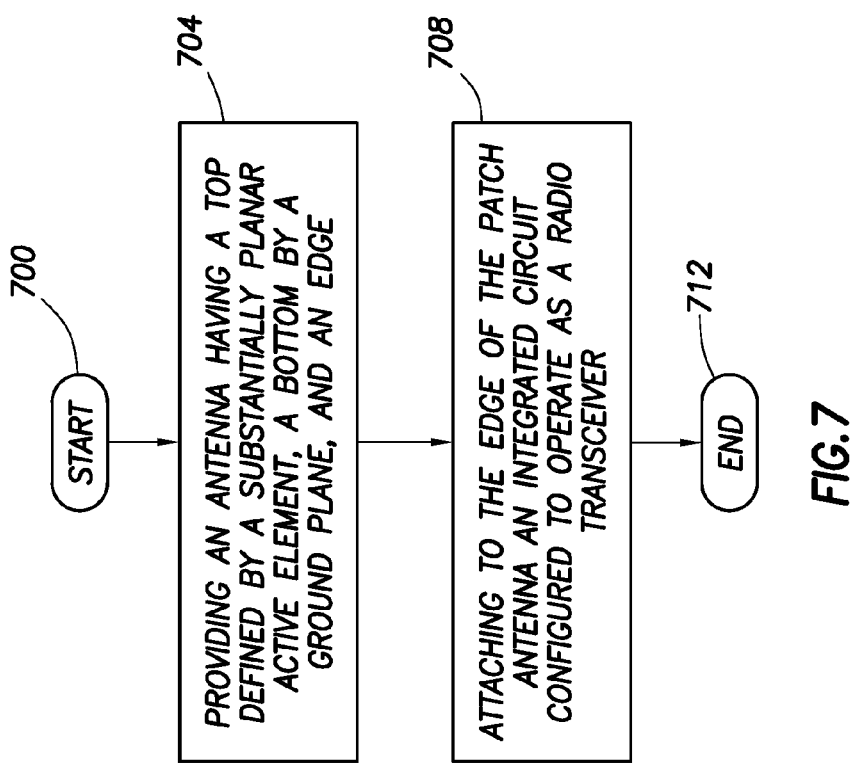

US 7,696,885 B2

METHODS AND SYSTEMS OF ATTACHING A RADIO TRANSCEIVER TO AN ANTENNA

BACKGROUND

1. Field

This disclosure is directed to antenna and radio frequency transceivers combinations.

2. Description of the Related Art

Radio frequency identification (RFID) tags comprise an antenna communicatively coupled to a RFID circuit. In some cases the RFID circuit and antenna are manufactured on the same substrate. In other cases, the RFID circuit is manufactured separately from the antenna, and the antenna and RFID circuit are communicatively coupled, such as by a cable. For small RFID tags, or situations where the cost of the tag needs to be low, coupling by way of a wire or cable makes assembly mechanically complex, thus driving up the cost of each tag.

BRIEF DESCRIPTION OF THE DRAWINGS

For a detailed description of various embodiments, reference will now be made to the accompanying drawings in which:

FIG. 3 shows a partial elevation view of embodiments where a bare-die RFID circuit couples to the patch antenna 20;

FIG. 6 shows a perspective view of embodiments of a radio transceiver coupled to a Yagi-Uda antenna;

FIG. 7 shows a method in accordance with at least some embodiments; and

FIG. 8 shows a method in accordance with other embodiments.

NOTATION AND NOMENCLATURE

Certain terms are used throughout the following description and claims to refer to particular system components. As one skilled in the art will appreciate, design and manufacturing companies may refer to the same component by different names. This document does not intend to distinguish between components that differ in name but not function. In the following discussion and in the claims, the terms "including" and "comprising" are used in an open-ended fashion, and thus should be interpreted to mean "including, but not limited to . . ."

Also, the term "couple" or "couples" is intended to mean either an indirect or direct connection. Thus, if a first device couples to a second device, that connection may be through a direct connection or through an indirect connection via other intermediate devices and connections. Moreover, the term "system" means "one or more components" combined together. Thus, a system can comprise an "entire system," "subsystems" within the system, a radio frequency identification (RFID) tag, a RFID reader, or any other device comprising one or more components.

DETAILED DESCRIPTION OF DISCLOSED EMBODIMENTS

The various embodiments were developed in the context of RFID systems, and particularly RFID tags, and the discussion is thus based on the developmental context; however, applicability of the systems and methods described herein extend beyond just RFID systems to any system using a radio transceiver, and thus the developmental context should not be read as a limitation as to the breadth of the applicability of the systems and methods described.

Figure 1:
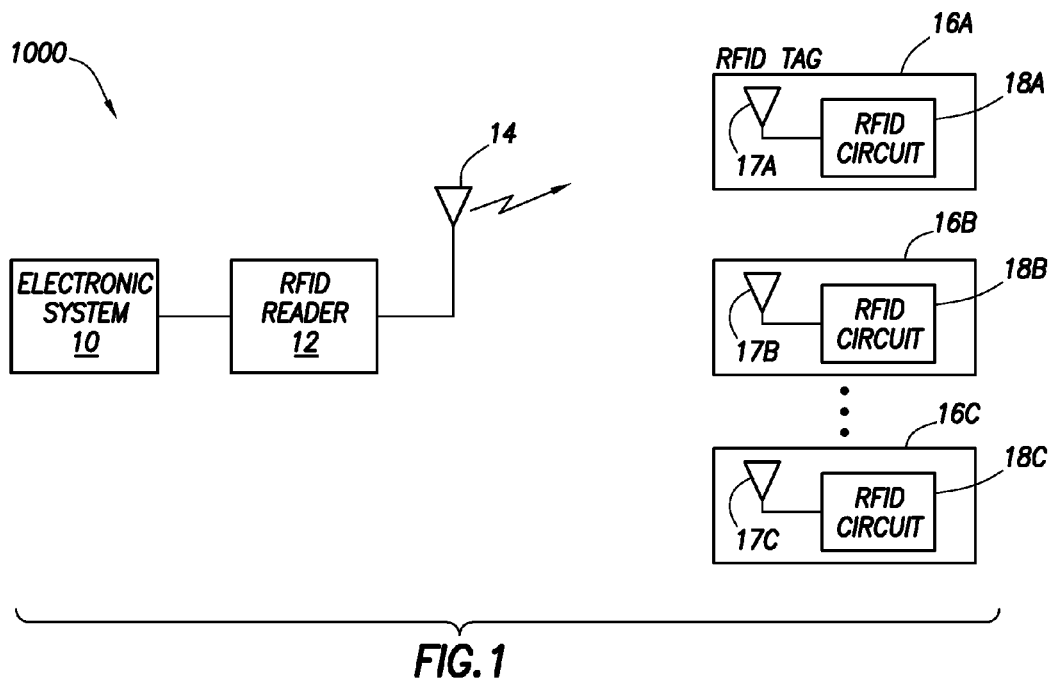
FIG. 1 shows a radio frequency identification system in accordance with at least some embodiments.

FIG. 1 illustrates a system 1000 in accordance with at least some embodiments. In particular, system 1000 comprises an electronic system 10 (e.g., a computer system) coupled to a radio frequency identification (RFID) reader 12. The RFID reader 12 may be equivalently referred as an interrogator. By way of antenna 14, the RFID reader 12 communicates with one or more RFID tags 16A-16C proximate to the RFID reader (i.e., within communication range).

Considering a single RFID tag 16A (but the description equally applicable to all the RFID tags 16), the communication sent by the RFID reader 12 is received by tag antenna 17A, and passed to the RFID circuit 18A. If the communication from the RFID reader triggers a response, the RFID circuit 18A sends to the RFID reader 12 the response (e.g., a tag identification value, or data held in the tag memory) using the tag antenna 17A. The RFID reader 12 passes data obtained from the various RFID tags 16 to the electronic system 10, which performs any suitable function. For example, the electronic system 10, based on the data received from the RFID tags 16, may allow access to a building or parking garage, note the entrance of an employee to a work location, or direct a parcel identified by the RFID tag 16 down a particular conveyor system.

There are several types of RFID tags operable in the illustrative system 1000. For example, RFID tags may be active tags, meaning each RFID tag comprises its own internal battery or other power source. Using power from the internal power source, an active RFID tag monitors for signals from the RFID reader 12. When an interrogating signal directed to the RFID tag is sensed, the tag response may be tag-radiated radio frequency (RF) power using power from the internal battery or power source, with a carrier modulated to represent the data or identification value.

A second type of RFID tag is a semi-active tag. A semi-active tag has an internal battery or power source, but a semi-active tag remains dormant (i.e., powered-off or in a low power state) most of the time. When an antenna of a semi-active tag receives an interrogating signal, the power received is used to wake or activate the semi-active tag, and a response (if any) comprising an identification value is sent by modulating the RF backscatter from the tag antenna, with the semi-active tag using power for internal operations from its internal battery or power source. In particular, the RFID reader 12 and antenna 14 continue to transmit power after the RFID tag is awake. While the RFID reader 12 transmits, the tag antenna 17 of the RFID tag 16 is selectively tuned and de-tuned with respect to the carrier frequency. When tuned, significant incident power is absorbed by the tag antenna 17. When de-tuned, significant power is reflected from the tag antenna 17 to the antenna 14 of the RFID reader 12. The data or identification value modulates the carrier to form the reflected or backscattered electromagnetic wave. The RFID reader 12 reads the data or identification value from the backscattered electromagnetic waves. Thus, in this specification and in the claims, the terms "transmitting" and "transmission" include not only sending from an antenna using internally sourced power, but also sending in the form of back-scattered signals.

A third type of RFID tag is a passive tag, which, unlike active and semi-active RFID tags, has no internal battery or power source. The tag antenna 17 of the passive RFID tag receives an interrogating signal from the RFID reader, and the power extracted from the received interrogating signal is used to power the tag. Once powered or "awake," the passive RFID tag may accept a command, send a response comprising a data or identification value, or both; however, like the semi-active tag, the passive tag sends the response in the form of RF backscatter.

Figure 2:
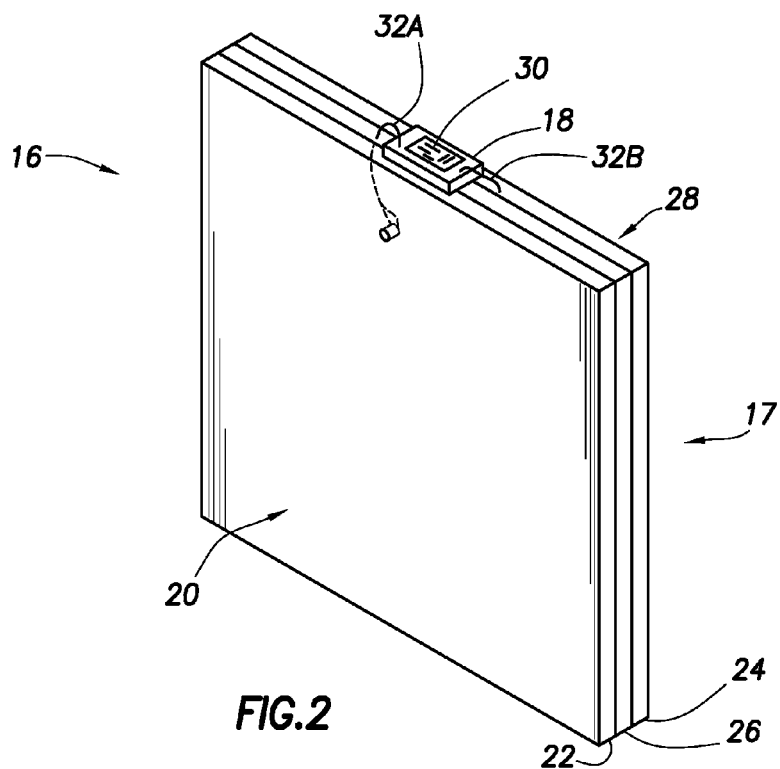
FIG. 2 shows a perspective view of an RFID tag in accordance with at least some embodiments.

FIG. 2 shows an RFID tag 16 in accordance with at least some embodiments. In particular, the RFID tag 16 comprises a tag antenna 17 (in these embodiments a patch antenna 20) and an RFID circuit 18 both electrically and mechanically coupled to the patch antenna 20. The patch antenna 20 comprises a driven or active element 22 separated from a ground plane 24 by way of a layer of insulation 26. The active element 22 defines a front of the patch antenna 20 and the ground plane 24 defines a back of the patch antenna 20. The edges of the active element 22, insulation 26 and ground plane 24 define a substantially co-planar edge 28 of antenna 20. In some embodiments, the edge 28 defines a plane that is perpendicular to a plane defined by the active element 22. In accordance with at least some embodiments described in more detail below, the RFID circuit mechanically couples to the patch antenna 20 on the edge 28.

In some embodiments, the RFID circuit 18 is a "bare die." That is, a plurality of RFID circuits may be manufactured on single semiconductor wafer. Once manufacturing (and in some cases testing) is complete, the semiconductor wafer is cut such that each RFID circuit is physically separated from other RFID circuits on the semiconductor wafer, with cutting to separate the circuits sometimes referred to as "singulating" to produce singulated dies. In the embodiments illustrated by FIG. 2, the RFID circuit 18 is a singulated die that is not subjected to further packaging, hence is a "bare die." In the embodiments illustrated by FIG. 2, circuitry 30 of the RFID circuit 18 faces away from the edge 28, and the underlying substrate of the RFID circuit 18 is adhered to the edge 28. In order to electrically couple the RFID circuit to the patch antenna 20, wire-bond connections 32 are used.

FIG. 3 illustrates alternative embodiments where the bare die RFID circuit 18 couples to the patch antenna 20 without wire bonding. In particular, FIG. 3 illustrates an elevation view of the RFID circuit 18 coupled to the patch antenna 20 (only partially shown) by way of edge 28. Rather than having the circuit of the RFID circuit 18 face away from the edge 28, in these embodiments the circuitry faces the edge 28 (i.e., "flip-chip"). The RFID circuit 18 electrically and mechanically couples to the patch antenna 20 by way of a plurality of solder balls 40. In other embodiments, conductive epoxy balls (e.g., epoxy mixed with silver or other metal) may be used in place of solder balls 40. Coupling by way of conductive balls may be referred to as controlled collapse chip connection.

Thus, in the embodiments of FIG. 3 the RFID circuit electrically couples to the active element and the ground plane by way of the solder balls 40 (or other conductive materials), and the electrical connections also provide mechanical support for the RFID circuit 18. In some embodiments, the mechanical support provided by the balls 40 may be sufficient to physically couple the RFID circuit 18 to the patch antenna 20, but in other embodiments the volume between the RFID circuit 18 and the patch antenna 20 may be filled with a non-conductive material, such as a non-conductive epoxy 42, which adds to the mechanical strength of the coupling. In yet still other embodiments, the non-conductive epoxy 42 may also cover the RFID circuit 18.

Figure 4:
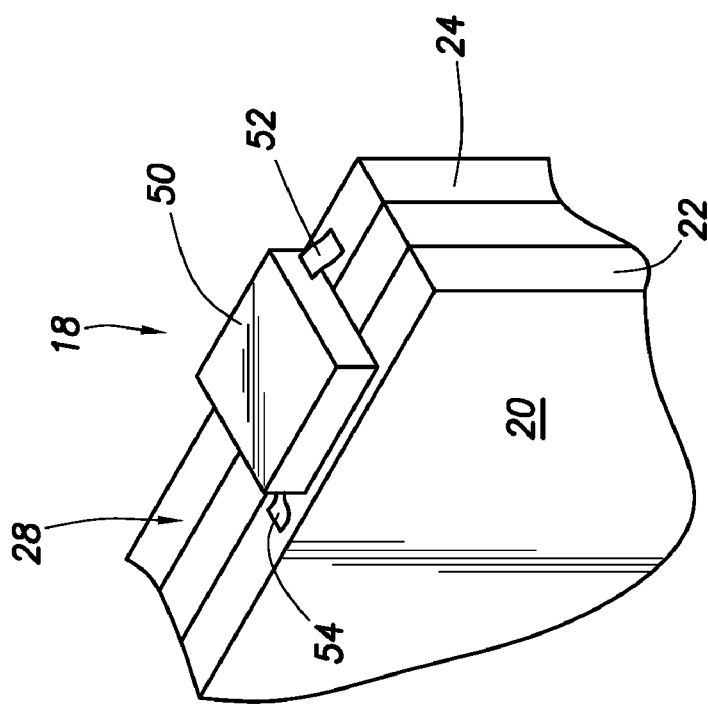
FIG. 4 shows a partial perspective view of embodiments where the RFID circuit is a packaged semiconductor device having a plurality of leads.

The various embodiments discussed to this point have been in relation to bare die RFID circuits, coupled by wire bonding or in a flip-chip configuration using controlled collapse chip connection. In other embodiments, the RFID circuit may be a packaged semiconductor device. That is, after singulation the RFID circuit may be packaged in a plastic or ceramic, with electrical connections to the RFID circuit within the packaging by way of electrical pins or leads. In particular, FIG. 4 shows embodiments where the RFID circuit 18 is packaged semiconductor device 50 having leads 52 and 54. In these embodiments, the RFID circuit (in the form of the packaged semiconductor device 50) both electrically and mechanically couples to the edge 28 by way of solder connections between the leads 52, 54 and the ground plane 24 and active element 22, respectively. If further mechanical support is desired, a non-conductive adhesive may be placed between the packaged semiconductor device 50 and the edge 28 (e.g., non-conductive epoxy in a configuration similar to that of FIG. 3), or the non-conductive adhesive may surround the packaged semiconductor device 50. Moreover, while FIG. 4 illustrate the lead 54 coupled to the active element 22 on edge 28, in other embodiments the lead 54 may couple to a feed point spaced from the edge 28 and within the area defined by the active element by way of micro-strip transmission line or wire.

Figure 5:
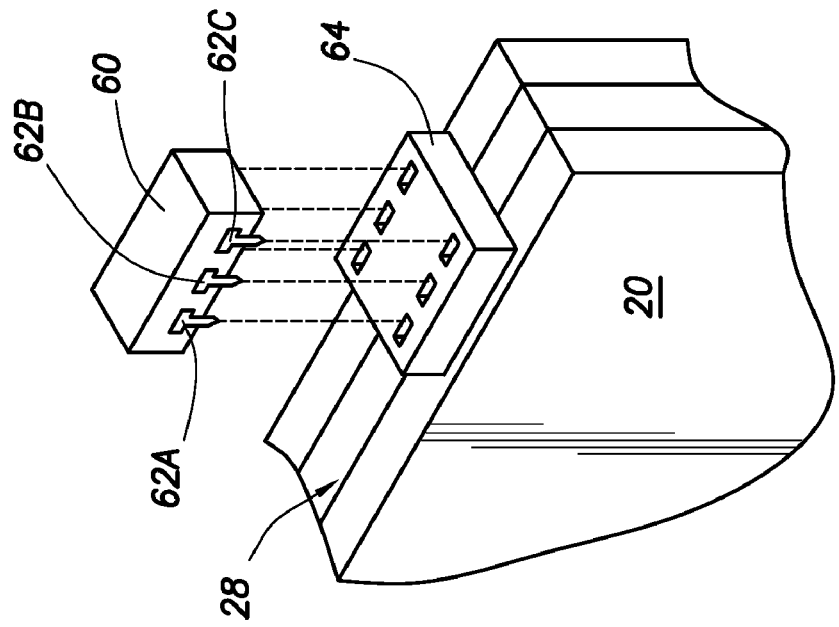
FIG. 5 shows a partial perspective view of yet still further embodiments of attaching a RFID circuit in the form of a packaged semiconductor device coupled to a patch antenna.

FIG. 5 illustrates yet still further embodiments of coupling a RFID circuit in the form of a packaged semiconductor device to the patch antenna. In these embodiments, the RFID circuit in the form of a packaged semiconductor device 60 has leads 62 (there may be more leads 62 than actually used by the RFID circuitry) configured to couple to a socket 64. In particular, the socket 64 mechanically and electrically couples to edge 28. For example, the electrical connections of the socket may directly couple to the illustrative active element and/or ground plane. The RFID circuit in the form of the packaged semiconductor device 60 electrically and mechanically couples to the socket 64.

The various embodiments discussed to this point have been in relation to coupling a RFID circuit to a patch antenna; however, the direct coupling of a RFID circuit to an antenna is not limited to patch antennas, and is extendable to other types of antenna, particularly antennas whose active elements are made of conductors having a circular cross-section (e.g., copper tubing or wire, and as opposed to active elements in form of metallic sheets as in patch antennas). FIG. 6 illustrates a Yagi-Uda antenna 70. Yagi-Uda antennas are characterized by an active element 72 being a dipole in combination with a reflector 74 and in some cases a director 76. The active element 72 is electrically isolated from the main mast 80, reflector 74 and director 76 by an insulating material 82. In accordance with the various embodiments, the Yagi-Uda antenna physically supports a radio transceiver 78 (such as a RFID circuit or RFID reader). In the embodiments of FIG. 6, the radio transceiver 78 in the form of a packaged semiconductor device couples between the dipole 72 and main mast 80. In alternative embodiments, the radio transceiver 78 in the form of a packaged semiconductor device is used in conjunction with a socket (e.g., FIG. 5). In yet still other embodiments, the radio transceiver 78 may be a bare die device, and thus the radio transceiver 78 may mechanically couple to the Yagi-Uda antenna 70 by way of an adhesive, and electrically couple by wire bonding (e.g., FIG. 2, and either directly coupled to the dipole 72, or by way of a wire or cable), or the bare die radio transceiver 78 may both mechanically and electrically couple by way of controlled collapse chip connection.

The Yagi-Uda antenna of FIG. 6 is merely illustrative of non-patch antennas of the various embodiments which can physically support a radio transceiver. Other illustrative antenns comprise: folded dipole antennas, bent dipole antennas; parabolic antennas; Quagi antennas; biquad antennas; egg-beater antennas; quadrifilar antennas; helix antennas; and J-pole antennas.

FIG. 7 illustrates methods in accordance with at least some embodiments. In particular, the method starts (block 700) and proceeds to providing an antenna having a top defined by a substantially planar active element, a bottom defined by a ground plane, and an edge (block 704). The antenna may be, for example, a patch antenna having a geometrically shaped active element, a patch antenna where the active element has grounded component ("F" shape or cross-section), or a patch antenna having an aperture in the active element. Regardless of the precise physical shape of the active element of the patch antenna, the method further comprises attaching to the edge of the patch antenna an integrated circuit configured to operate as a radio transceiver (block 708), and the method ends (block 712). The attaching may take many forms. In embodiments where the radio transceiver is bare die, the attaching may involve mechanically attaching by way of an adhesive, and electrically coupling by way of wire-bond techniques. In other embodiments, the bare-die radio transceiver may attached in a flip-chip fashion using a controlled collapse chip connection by way of solder or conductive balls. A non-conductive adhesive (e.g., epoxy) may be used to reinforce the physical coupling. In yet other embodiments, the radio frequency transceiver may take the form a packaged semiconductor device, and thus may couple to the antenna by way of a socket, or by direct soldering of leads of the packaged semiconductor device to the antenna.

FIG. 8 illustrates methods in accordance with at least some embodiments. In particular, the method starts (block 800) and proceeds to providing an antenna having an active element with a substantially circular cross-section in one plane (block 804). The antenna may be, for example: a Yagi-Uda antenna; folded dipole antenna; a bent dipole antenna; a parabolic antenna; a Quagi antenna; a biquad antenna; an egg-beater antenna; a quadrifilar antenna; a helix antenna; or a J-pole antenna. Regardless of the precise physical shape of the antenna, the method further comprises mechanically attaching to the antenna an integrated circuit configured to operate as a radio transceiver (block 808), and the method ends (block 812). The attaching may take many forms. In embodiments where the radio transceiver is bare die, the attaching may involve mechanically attaching by way of an adhesive, and electrically coupling by way of wire-bond techniques. In other embodiments, the bare die radio transceiver may attached in a flip-chip fashion using a controlled collapse chip connection by way of solder or conductive balls. A non-conductive adhesive (e.g., epoxy) may be used to reinforce the mechanical coupling. In yet other embodiments, the radio frequency transceiver may take the form a packaged semiconductor device, and thus may couple to the antenna by way of a socket, or by direct soldering of leads of the packaged semiconductor device to the antenna.

The above discussion is meant to be illustrative of the principles and various embodiments of the present invention. Numerous variations and modifications will become apparent to those skilled in the art once the above disclosure is fully appreciated. For example, FIGS. 2-5 show a patch antenna; however, patch antennas may take many forms. The active element for a patch antenna may comprise not only geometric shapes (e.g., square, rectangle), but also other shapes capable of radiating and/or receiving electromagnetic energy (e.g., fractal patterns, inverted "F" shapes where a portion of the active element directly couples to the ground plane, and "trough" radiators where the radiation is caused by current flow around an aperture of the active element. It is intended that the following claims be interpreted to embrace all such variations and modifications.

What is claimed is:

1. A system comprising:
   an antenna comprising:
      a ground plane having a first edge surface on a perpendicular plane;
      an active element having a second edge surface;
      wherein the ground plane and the active element are retained together such that the first and second edge surfaces are substantially coplanar and form an antenna edge; and
      an integrated circuit of a tag in communication with a reader, the integrated circuit configured to operate as a radio transceiver, the integrated circuit mechanically coupled to and supported on the antenna edge, and electrically coupled to the active element.

2. The system according to claim 1 wherein the integrated circuit is a radio frequency identification (RFID) circuit.

3. The system according to claim 1 wherein the integrated circuit is a bare die, and wherein the integrated circuit mechanically and electrically couples to the antenna edge by way of a controlled collapse chip connection.

4. The system according to claim 1 wherein the antenna is at least one selected from the group consisting of: a patch antenna; an inverted "F" patch antenna; and a fractal antenna.

5. A method comprising:
   providing an antenna having a ground plane with an edge on a perpendicular plane, and a top defined by a substantially planar active element; and
   supporting by and attaching to the edge an integrated circuit configured to operate as a radio transceiver.

6. The method according to claim 5 wherein attaching further comprises attaching at least one selected from the group consisting of: an RFID reader; and an RFID circuit.

7. The method according to claim 5 wherein attaching further comprises:
   adhering the integrated circuit being a bare die integrated circuit to the edge; and
   electrically coupling by at least one selected from the group consisting of: a wire bond;
   and a controlled collapse chip connection.

* * * * *